United States Patent
Kawai et al.

[11] Patent Number: 6,140,169
[45] Date of Patent: Oct. 31, 2000

[54] METHOD FOR MANUFACTURING FIELD EFFECT TRANSISTOR

[75] Inventors: Hiroji Kawai; Shunji Imanaga, both of Kanagawa, Japan

[73] Assignee: Sony Corporation, Tokyo, Japan

[21] Appl. No.: 09/283,696

[22] Filed: Apr. 1, 1999

Related U.S. Application Data

[62] Division of application No. 08/984,635, Dec. 3, 1997, Pat. No. 5,929,467.

[30]     Foreign Application Priority Data

Dec. 4, 1996  [JP]  Japan .................................. 8-324368

[51] Int. Cl.$^7$ ................................................. H01L 21/336
[52] U.S. Cl. ............................. 438/197; 438/183; 438/184
[58] Field of Search ..................................... 438/142, 167,
                            438/172, 180, 181, 182, 183, 184, 197,
                            585

[56]              References Cited

U.S. PATENT DOCUMENTS 4,030,942  6/1977  Keenan et al. .
4,642,879  2/1987  Kawata et al. .
4,843,024  6/1989  Ito .
5,447,874  9/1995  Grivna et al. .

FOREIGN PATENT DOCUMENTS 401023571A  1/1989  Japan .
401082671A  3/1989  Japan .

*Primary Examiner*—Charles Bowers
*Assistant Examiner*—Keith Christianson
*Attorney, Agent, or Firm*—Hill & Simpson

[57]                  ABSTRACT

A GaN-type field effect transistor exhibits a large input amplitude by using a gate insulating film. A channel layer and a gate insulating film are sequentially laminated on a substrate with a buffer layer therebetween. A gate electrode is formed on the gate insulating film. A source electrode and a drain electrode are disposed at the both sides of the gate electrode and are electrically connected to the channel layer via openings. The channel layer is formed from n-type GaN. The gate insulating film is made from AlN, which exhibits excellent insulation characteristics, thus increasing the Schottky barrier and achieving a large input amplitude. If the FET is operated in the enhancement mode, it is operable in a manner similar to a Si-MOS-type FET, resulting in the formation of an inversion layer.

12 Claims, 11 Drawing Sheets

METHOD FOR MANUFACTURING FIELD EFFECT TRANSISTOR

This is a divisional of application Ser. No. 08/984,635, filed on Dec. 3, 1997 Now U.S. Pat. No. 5,929,467.

BACKGROUND OF THE INVENTION

1. Field of the Invention

The present invention relates to a field effect transistor in which a channel layer is formed of a Group-III nitride compound semiconductor containing nitrogen and at least one of Group-III elements consisting of the group of gallium (Ga), aluminum (Al), boron (B) and indium (In). The invention-also relates to a manufacturing method for the above type of field effect transistor. More particularly, the invention pertains to the above type of field effect transistor having a gate insulating film between a gate electrode and a channel layer. The invention is also concerned with a manufacturing method for this type of field effect transistor.

2. Description of the Related Art

Gallium nitride (GaN), which is a Group-III nitride compound semiconductor, has a large forbidden band gap, such as 3.4 eV. The indirect transition conduction band is positioned at a level higher than the forbidden band by more than 1.5 eV. The saturation velocity of GaN is approximately $2.5 \times 10^7$ cm/s, which is higher than other types of semiconductors, such as silicon (Si), gallium arsenide (GaAs), and silicon carbide (SiC). Further, the breakdown electric field of GaN is approximately $5 \times 10^6$ V/cm, which is greater than SiC and much greater than Si and GaAs by more than one order of magnitude. Thus, it has been expected that GaN can be used as a material for high-frequency, high-temperature, and high-power semiconductor devices.

In recent years, prototypes of semiconductor devices using GaN have been made. Among such devices, the transistors configured in a manner similar to the GaAs-type field effect transistors (FETs) have been reported.

Figure 16:
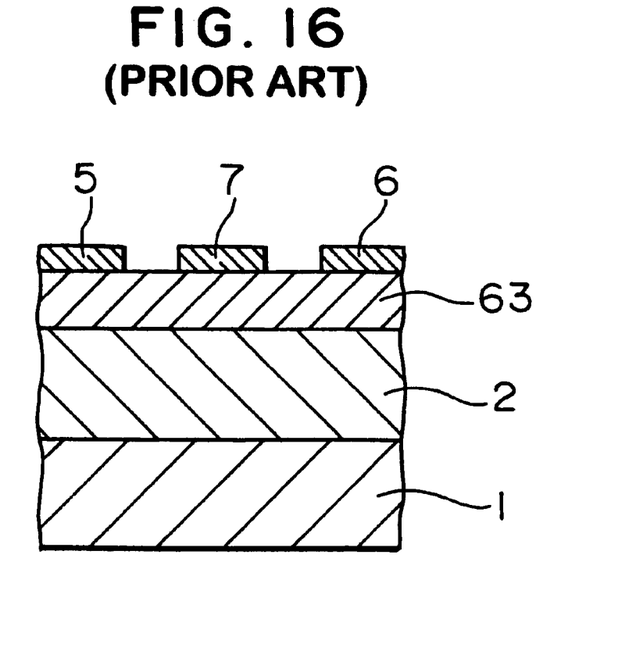
FIG. 16 is a sectional view illustrating the configuration of a conventional FET.
Figure 17:
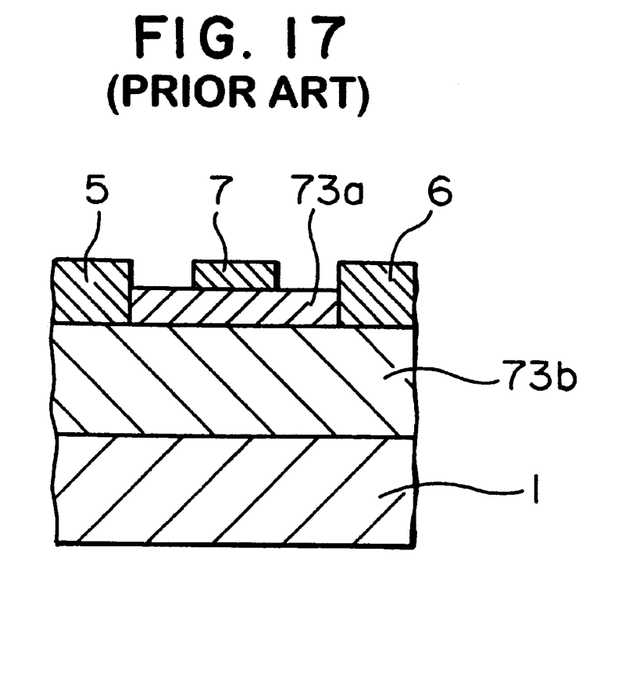
FIG. 17 is a sectional view illustrating the configuration of another conventional FET.

FIGS. 16 and 17 illustrate examples of conventional FETs using GaN. The FET shown in FIG. 16 has the following metal semiconductor (MES) structure (M. A. Kahn, A. P L.,62(15), 1786(1993)). An n-type GaN active layer 63 is formed on a sapphire substrate 1 with an intrinsic-GaN buffer layer 2 therebetween. A gate electrode 7, a source electrode 5, and a drain electrode 6 are disposed on the active layer 63. In contrast, the FET illustrated in FIG. 17 has the following high electron mobility transistor (HEMT) structure (M. A. Kahn, A. P L.,65(9), 1121(1994)). An electron transit layer 73b made from impurity-undoped GaN and an electron supply layer 73a made from n-type AlGaN are sequentially laminated on a sapphire substrate 1. A gate electrode 7 is formed on the electron supply layer 73a, and a source electrode 5 and a drain electrode 6 are disposed on the electron transit layer 73b on both sides of the electron supply layer 73a.

In another example of known FETs having the HEMT structure, the thickness of the AlGaN electron supply layer is decreased, thereby making the threshold gate voltage around 0 V (M. A. Kahn, A. P L.,68(4), 22(1996). This type of FET is referred to as "the enhancement-mode FET".

In the foregoing MES or HEMT-structured FETs, the Schottky barrier at the gate electrode between a metal and a semiconductor is comparatively low, such as approximately from 1 to 1.2 eV. Although this Schottky barrier is slightly greater than that of the GaAs-type FETs (0.7 eV), a large forward gate bias voltage cannot be applied. This shortcoming originates from the operation of the MES-structured FET rather than from the constituent material, i.e., GaN.

In contrast, a metal-oxide-semiconductor (MOS) FET, i.e, metal-insulator-semiconductor (MIS) FET, is used as a silicon (Si) FET. In this type of FET, a gate electrode is formed on a Si layer with a silicon oxide ($SiO_2$) film therebetween, which serves as a highly insulating film, used as a gate insulating film, and an inversion layer formed at the interface between the $SiO_2$ film and the Si layer is used as a channel, thereby achieving a large input amplitude.

Consequently, if the GaN-type FET uses a chemically stable gate insulating film which has a potential barrier as high as the $SiO_2$ film, an input amplitude as large as that of the Si FET can be expected. Accordingly, a great level of output can be obtained from the GaN-type FET due to the synergistic effect between the above-described large input amplitude and the high breakdown voltage inherent in the GaN-type FET.

SUMMARY OF THE INVENTION

Accordingly, in view of the above background, it is an object of the present invention to provide a GaN-type FET which obtains a large input amplitude by using a chemically stable gate insulating film and also to a manufacturing method for the above type of FET.

In order to achieve the above object, according to one aspect of the present invention, there is provided a field effect transistor comprising a channel layer being composed of a Group-III nitride compound semiconductor containing nitride and at least one of the Group-III elements selected from the group consisting of gallium (Ga), aluminum (Al), boron (B), and indium (In). A gate electrode is disposed on the channel layer. A gate insulating film is disposed between the gate electrode and the channel layer and is composed of a Group-III nitride compound semiconductor containing at least aluminum as a Group-III element.

According to another aspect of the present invention, there is provided a manufacturing method for a field effect transistor of the type in which a source electrode and a drain electrode are disposed on a channel layer composed of a Group-III nitride compound semiconductor containing nitride and at least one of the Group-III elements selected from the group consisting of gallium (Ga), aluminum (Al), boron (B), and indium (In), and a gate electrode is formed on the channel layer with a gate insulating film therebetween. The above manufacturing method comprises the steps of: forming a gate-insulating-film forming layer after the channel layer is formed; forming a dummy gate, which serves as the gate electrode, on the gate-insulating-film forming layer; forming side walls on lateral surfaces of the dummy gate; and forming the gate insulating film by selectively removing the gate-insulating-film forming layer using the dummy gate and the side walls as a mask.

In the foregoing FET, upon applying a voltage to the gate electrode, the drain current increases or decreases in accordance with the applied voltage. A gate insulating film composed of a high-resistance Group-III nitride compound semiconductor containing at least aluminum is interposed between the gate electrode and the channel layer, thereby increasing the insulation barrier of the gate electrode. Accordingly, a large voltage can be applied to the gate electrode. Moreover, since the gate insulating film has high insulation characteristics, the thickness of the film can be decreased, thereby elevating the mutual conductance $g_m$ and operating the FET at high speed.

According to the manufacturing method for the above FET, after the gate-insulating-film forming layer is formed on the channel layer, the dummy gate is formed, and the side walls are made on the lateral surfaces of the dummy gate. The gate-insulating-film forming layer is then selectively removed by using the dummy gate and the side walls as a mask, thereby forming a gate insulating film.

BRIEF DESCRIPTION OF THE DRAWINGS

FIG. 12, which is comprised of FIGS. 12A and 12B, is a sectional view illustrating the manufacturing process steps of the FET shown in FIG. 11;

FIG. 13, which is comprised of FIGS. 13A and 13B, is a sectional view illustrating the manufacturing process steps following the steps shown in FIG. 12;

FIG. 14, which is comprised of FIGS. 14A and 14B, is a sectional view illustrating the manufacturing process steps following the steps shown in FIG. 13;

DESCRIPTION OF THE PREFERRED EMBODIMENTS

The preferred embodiments of the present invention will now be explained with reference to the drawings.
(First Embodiment)

Figure 1:
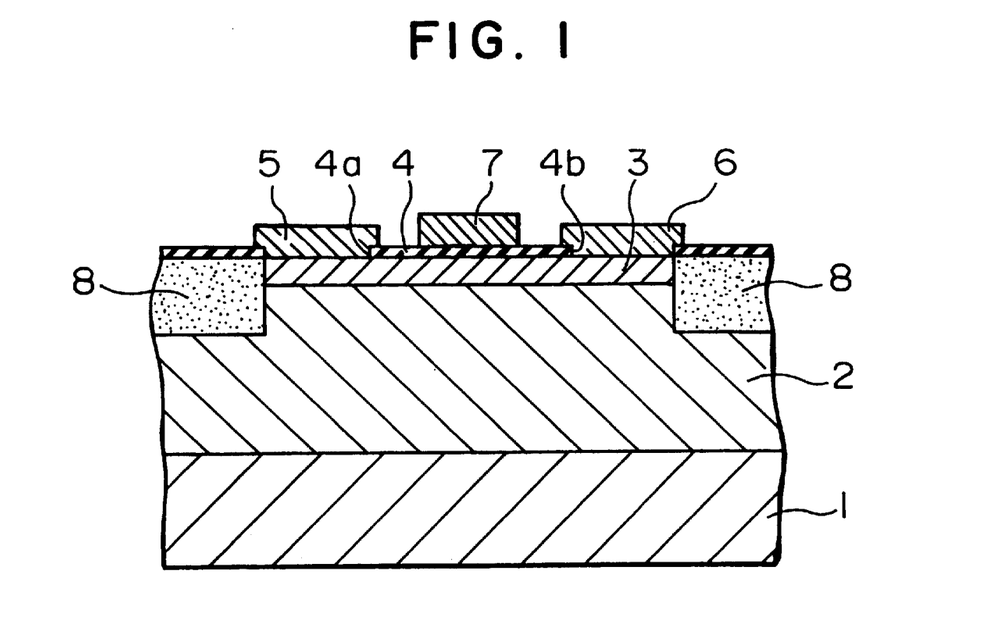
FIG. 1 is a sectional view illustrating the configuration of a FET according to a first embodiment of the present invention.

FIG. 1 illustrates the configuration of a FET according to a first embodiment of the present invention. In this FET, a channel layer 3 and a gate insulating film 4 are sequentially laminated on a sapphire substrate 1 (for example, a c-surface substrate) with a buffer layer 2 therebetween. Formed on the gate insulating film 4 are a source electrode 5, which is electrically connected to the channel layer 3 via an opening 4a of the gate insulating film 4, and a drain electrode 6, which is electrically connected to the channel layer 3 via an opening 4b of the gate insulating film 4. Further, a gate electrode 7 is disposed on the gate insulating film 4 between the source electrode 5 and the drain electrode 6. The source electrode 5, the drain electrode 6, and the gate electrode 7 are formed by sequentially laminating, for example, titanium (Ti), aluminum (Al), and gold (Au), from the upper surface of the substrate 1.

The buffer layer 2 is formed from, for example, high-resistance intrinsic GaN, and has a thickness of, for example, 2 $\mu$m. The channel layer 3 is made from n-type GaN doped with an n-type impurity, such as Si, and has a thickness of, for example, 0.1 $\mu$m. The concentration of the n-type impurity is, for example, $1\times10^{18}$ cm$^{-3}$. The impurity concentration and the thickness of the channel layer 3 can be controlled to suitably adjust the gate threshold voltage. More specifically, the impurity concentration increases to set the FET in the normally on-mode (depletion mode), while the impurity concentration decreases to set the FET in the normally off-mode (enhancement mode).

For example, when the thickness of the channel layer 3 is 0.1 $\mu$m, and the impurity concentration is not higher than $5\times10^{15}$ cm$^{-3}$, the FET is operated in the enhancement mode. Likewise, with the channel layer 3 having the above impurity concentration of $1\times10^{18}$ cm$^{-3}$, the FET is operated in the depletion mode. Further, when the channel layer 3 has an impurity concentration of not higher than $5\times10^{14}$ cm$^{-3}$, the following MOS-operating enhancement mode is employed. Upon application of a positive voltage to the gate electrode 7, electrons are excited not in the channel layer 3 but in the interface closer to the channel layer 3 than the gate insulating film 4.

Figure 2:
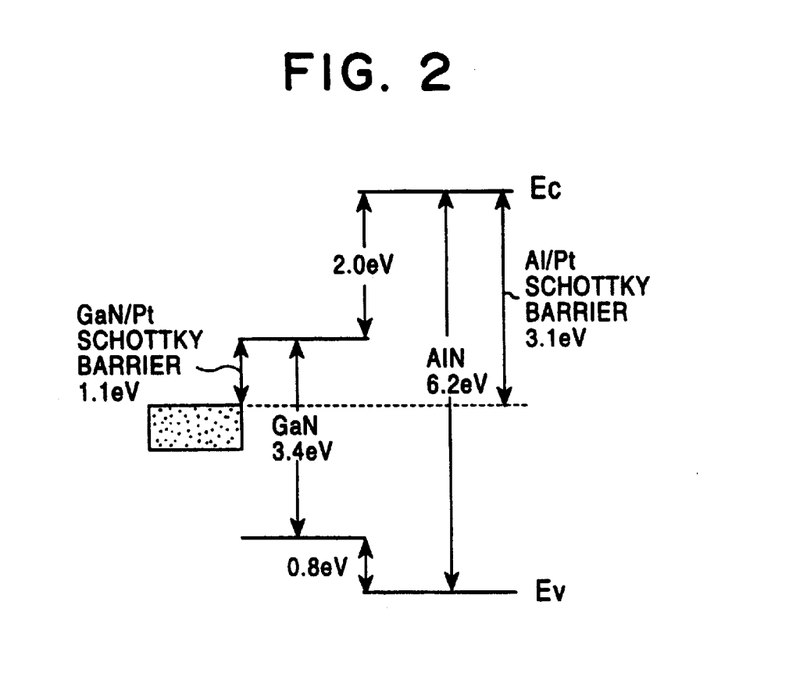
FIG. 2 schematically illustrates the band connecting state between AlN and GaN and between Pt and GaN.

The gate insulating film 4 is made from, for example, aluminum nitride (AlN), and has a thickness of, for example, 3 nm. FIG. 2 illustrates the band-connecting states between AlN and GaN and between platinum (Pt) and GaN. The state between AlN and GaN is represented by a direct-transition band structure. The band connection ratio between AlN and GaN ($\Delta Ec/\Delta Eg$) is estimated as substantially similar to that of GaAs-type FET, such as approximately 0.7. FIG. 2 also shows an experimentally known Schottky barrier (1.1 eV) between GaN and Pt (L. Wang, A. P L.,68(9), 1267(1996)). Although the Schottky barrier between AlN and a metal is still unknown, the Schottky barrier between AlN and Pt is estimated as approximately 3.1 eV, which is about three times as large as the gate Schottky barrier of a GaN device or a GaN-type HEMT device and is also equivalent to the Schottky barrier between SiO$_2$ and a metal. The Schottky barrier is, in general, designated as the difference between the work function of an electrode metal and the electron affinity of a semiconductor. In this embodiment, however, for convenience sake the difference between the work function of an electrode metal and the electron affinity of an insulator, such as AlN or SiO$_2$, is also referred to as the Schottky barrier.

Figure 3:
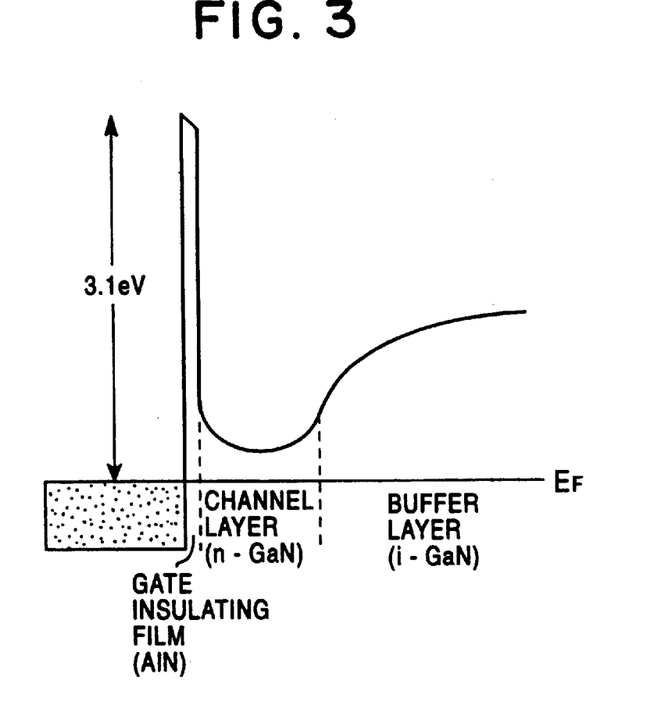
FIG. 3 schematically illustrates the conduction band under the gate electrode of the FET shown in FIG. 1.
Figure 4:
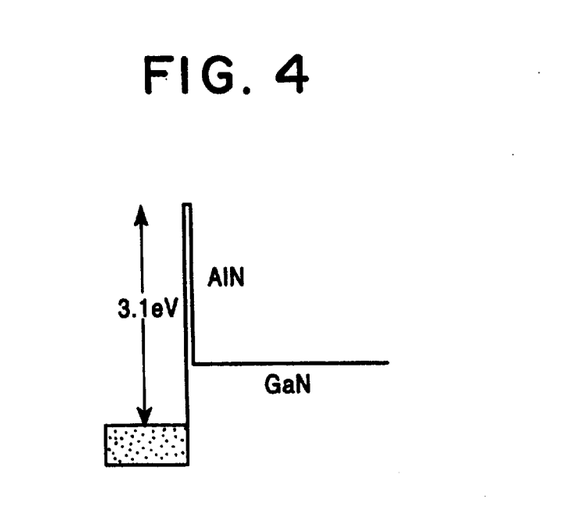
FIG. 4 schematically illustrates the flat conduction band under the gate electrode when the channel layer is formed from intrinsic GaN.

FIG. 3 schematically illustrates the conduction band under the gate electrode 7 of the FET of this embodiment. FIG. 3 shows that the insulating potential of the gate electrode 7 increases by virtue of the presence of the gate insulating film 4. FIG. 4 schematically illustrates the flat conduction band under the gate electrode 7 when the channel layer 3 is formed from intrinsic GaN. As is seen from FIG. 4, if the channel layer 3 is made from intrinsic GaN or GaN having a very low impurity concentration, an inversion layer can be formed by applying a positive voltage to the gate electrode 7 in a manner similar to a Si-MOS FET.

Figure 5:
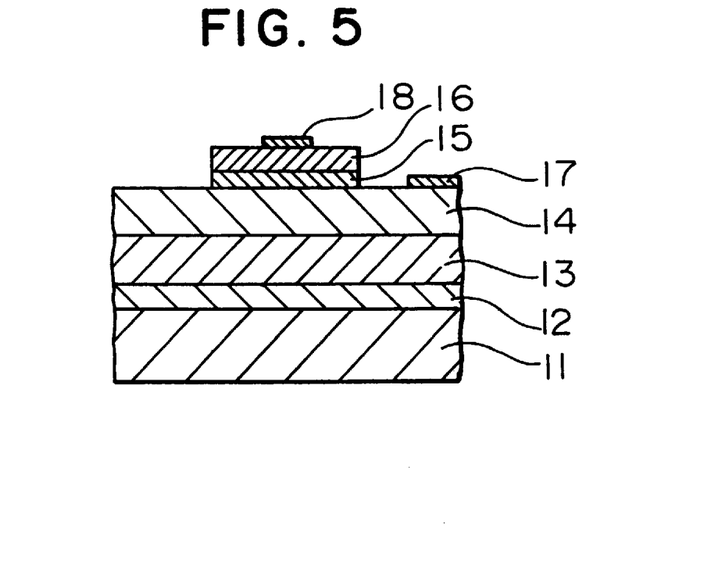
FIG. 5 is a sectional view illustrating the configuration of an n-GaN/AlN/n-GaN diode used in the test for checking the AlN insulation characteristics.

The AlN insulation characteristics were previously reported (A. Bykhovski, J. Appl. Phys.,77(4), 1616(1995)). In this paper, a test was made on an n-GaN/AlN/n-GaN diode configured in the following manner. As shown in FIG. 5, an AlN layer 12, an intrinsic i-GaN layer 13, an n-type GaN layer 14, an AlN layer 15, and an n-type GaN layer 16 were sequentially laminated on a sapphire substrate 11. Electrodes 17 and 18 were formed on the n-type GaN layer 14 and the n-type GaN layer 16, respectively. The thicknesses of the n-type GaN layer 14, the AlN layer 15, and the n-type GaN layer 16 were 1 $\mu$m, 3 nm, and 0.4 $\mu$m, respectively.

Figure 6:
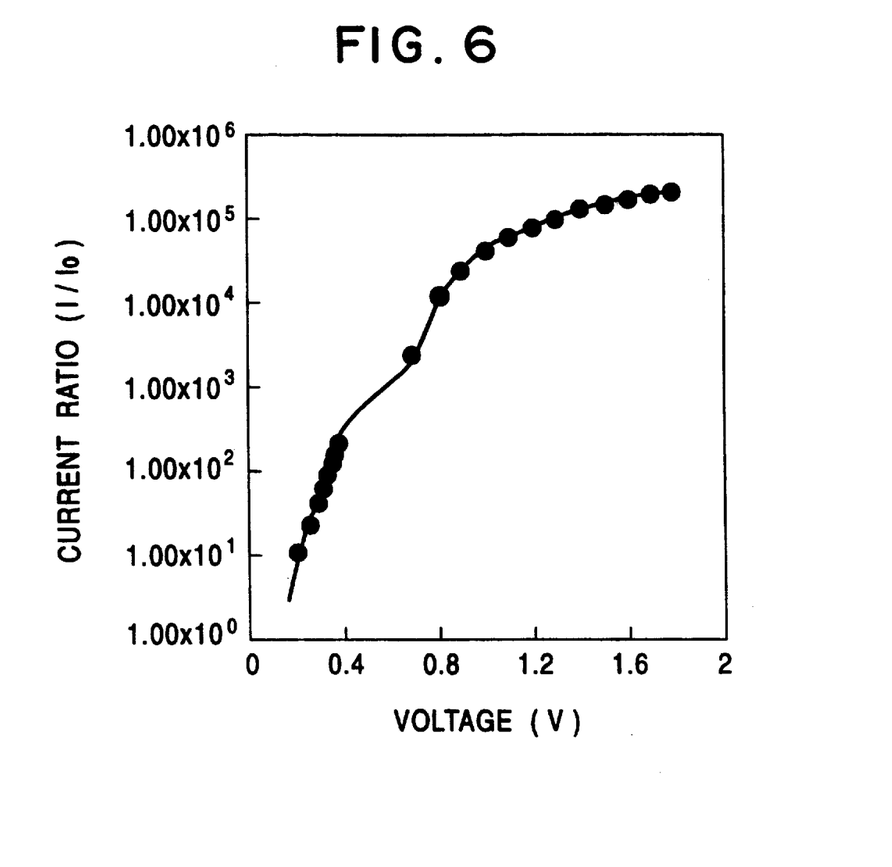
FIG. 6 is a characteristic diagram illustrating the relationship between the voltage and the current of the diode shown in FIG. 5.

The test results are shown in FIG. 6. When the voltage is 2 V, the current ratio (I/Io) is $3\times10^5$ with the conditions that Io is 0.034 nA, and the area of the device (diode) is 31400 $\mu$m$^2$. Accordingly, a current of approximately $3.2\times10^{-8}$ flows with a typical gate area of 100 $\mu$m$^2$, and the AlN layer 15 having a thickness of 3 nm sufficiently achieves good performance as the gate insulating film 4.

The above paper does not report the results when the thickness of the AlN layer 15 is less than 3 nm. Even if it is assumed that the current flowing when the thickness of the AlN layer 15 is on the order of 1 nm increases to 100 times as large as the current flowing when the thickness is 3 nm, i.e., to $3\times10^{-6}$ A, the gate insulating film 4 exhibits sufficiently good performance. It seems, however, difficult to uniformly form a wide area of the AlN layer 15 with a thickness less than 1 nm because the thickness change in a mono-atomic layer of AlN is about 0.3 nm. Accordingly, the thickness of the gate insulating film 4 is preferably not less than 1 nm.

Referring back to FIG. 1, the FET of this embodiment is suitably provided with separating portions 8 for separating the FET from the other devices in an area from the channel layer 3 adjacent to the peripheral portions of the source electrode 5 and the drain electrode 6 to part of the buffer layer 2. Helium (He) ions, for example, are implanted into the separating portions 8.

The FET configured as described above can be manufactured by the following procedure.

The c-surface sapphire substrate 1 is cleaned at 1050° C. in a hydrogen (H$_2$) gas atmosphere. Then, the temperature is lowered to, for example, 520° C., and a GaN underlying layer (not shown) having a thickness of 25 nm is grown while supplying material gases according to a metal organic chemical vapor deposition (MOCVD) method. The temperature is again raised to, for example, 1000° C., and the buffer layer 2, the channel layer 3, and the gate insulating film 4 are grown while supplying material gases according to the MOCVD method. In general, the GaN underlying layer is also referred to as "the-nucleation layer", which is known as the GaN growing method.

As the material gases, trimethyl gallium (Ga(CH$_3$)$_3$; TMG) is used as a gallium material, trimethyl aluminum (Al(CH$_3$)$_3$; TMA) is employed as an aluminum material, ammonium (NH$_3$) is used as a nitride material, and silane (SiH$_4$) is employed as an n-type impurity. The flow rates of the foregoing gases are as follows: TMG is 40 $\mu$mol/minute, TMA is 10 $\mu$mol/minute, ammonium is 0.4 mol/minute, and silane is approximately from 0.01 to 0.1 $\mu$mol/minute. Further, as carrier gases, a hydrogen gas (8 liters/minute) and a nitrogen gas (8 liters/minute) flow together with the material gases. The growing pressure is, for example, 250 Torr.

Subsequently, He ions, for example, are selectively implanted into regions to form the separating portions 8 which serve to separate the FET from other devices. The gate insulating film 4 is then partially removed by a reactive ion etching (RIE) method, thereby forming the openings 4a and 4b. Thereafter, titanium, aluminum, and gold are sequentially deposited to form the source electrode 5, the gate electrode 7, and the drain electrode 6 at the same time. The device is then heat-treated in a nitrogen gas atmosphere at, for example, 700° C. for one minute so as to reduce the contact resistances of the source electrode 5 and the drain electrode 6. As a consequence, the FET shown in FIG. 1 is fabricated.

The operation of the FET 1 will now be described.

The FET 1 of this embodiment is operated in the depletion mode. Thus, when a negative voltage is applied to the gate electrode 7, a depletion layer is formed within the channel layer 3 so as to decrease the drain current flowing between the source electrode 5 and the drain electrode 6. At this time, since the insulating barrier of the gate electrode 7 is high by virtue of the gate insulating film 4, a large voltage can be applied to the gate electrode 7, thereby achieving a high level of output. Since AlN has high insulation characteristics, the thickness of the gate insulating film 4 can be decreased. Accordingly, with the decreased distance between the gate electrode 7 and the channel layer 3, the relative dielectric constant of AlN is about 10, which is greater than the relative dielectric constant 4 of SiO2. This increases the mutual inductance $g_m$, thereby making the FET operable at high speed.

The operation of the FET in the enhancement mode is substantially similar to that of the FET in the depletion mode other than the following characteristics. Upon applying a positive voltage to the gate electrode 7, electrons are excited in the channel layer 3 so that a drain current flows between the source electrode 5 and the drain electrode 6. Further, the operation of the FET in the enhancement mode in which the channel layer 3 is made from intrinsic GaN or GaN having a very low impurity concentration is also substantially similar to the operation of the FET in the depletion mode other than the following characteristics. Upon applying a positive voltage to the gate electrode 7, electrons are excited at the interface closer to the channel layer 3 than the gate insulating film 4 where an inversion layer is formed. Accordingly, a drain current flows between the source electrode 5 and the drain electrode 6.

As is seen from the above description, according to the depletion-mode FET of this embodiment, by virtue of the AlN gate insulating film 4 provided between the gate electrode 7 and the channel layer 3, the FET is chemically stable and has a highly insulating barrier. Accordingly, a large gate voltage can be applied to the gate electrode 7, thereby obtaining a high level of output. Even if the FET is operated in the enhancement mode, a sufficiently large gate voltage can also be applied to the gate electrode 7, and the FET can be operated in a manner similar to the Si-MOS FET, resulting in the formation of an inversion layer. No matter whichever the type of the FET, the range of selections for constituent materials for the gate electrode 7 is extended, thereby increasing the flexibility in the manufacturing process.

Moreover, since the gate insulating film 4 is made from AlN, which has high insulation characteristics, an adequately high insulation effect can be exhibited even though the thickness of the film 4 is decreased. Also, the mutual conductance $g_m$ can be increased due to a high dielectric constant of AlN, thereby making it possible to operate the FET at high speed.

Moreover, the gate insulating film 4 is formed from the AlN underlaying film which has been grown according to the MOCVD method (i.e., epitaxially grown AlN), a high level of crystallizability can be obtained. As a result, required insulation characteristics can be achieved as designed. Additionally, the channel layer 3 is made from n-type GaN, which has also been grown according to the MOCVD method, the gate insulating film 4 can be fabricated continuously from the channel layer 3, thereby enhancing the simplicity of manufacturing the FET.

(Second Embodiment)

Figure 7:
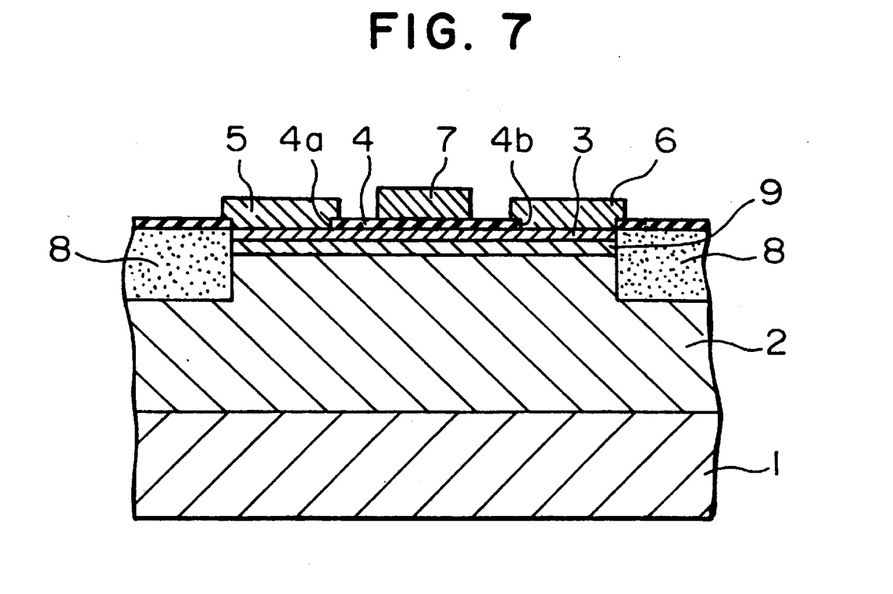
FIG. 7 is a sectional view illustrating the configuration of a FET according to a second embodiment of the present invention.

FIG. 7 illustrates the configuration of a FET according to a second embodiment of the present invention. The second embodiment is similar to the first embodiment except that a carrier barrier layer (an electron barrier layer 9 in this embodiment) is interposed between the channel layer 3 and the buffer layer 2. The same elements as those shown in FIG. 1 are designated by like reference numerals, and a detailed explanation thereof will thus be omitted.

The electron barrier layer 9 is formed from, for example, high-resistance intrinsic $Al_xGa_{1-x}N$ and has a thickness of, for example, 0.05 μm. The composition ratio of the above Group-III element is 20% aluminum and 80% gallium (i.e., x=0.2). The channel layer 3 has a thickness of, for example, 50 nm and has an impurity concentration of $2\times10^{18}$ $cm^{-3}$.

Figure 8:
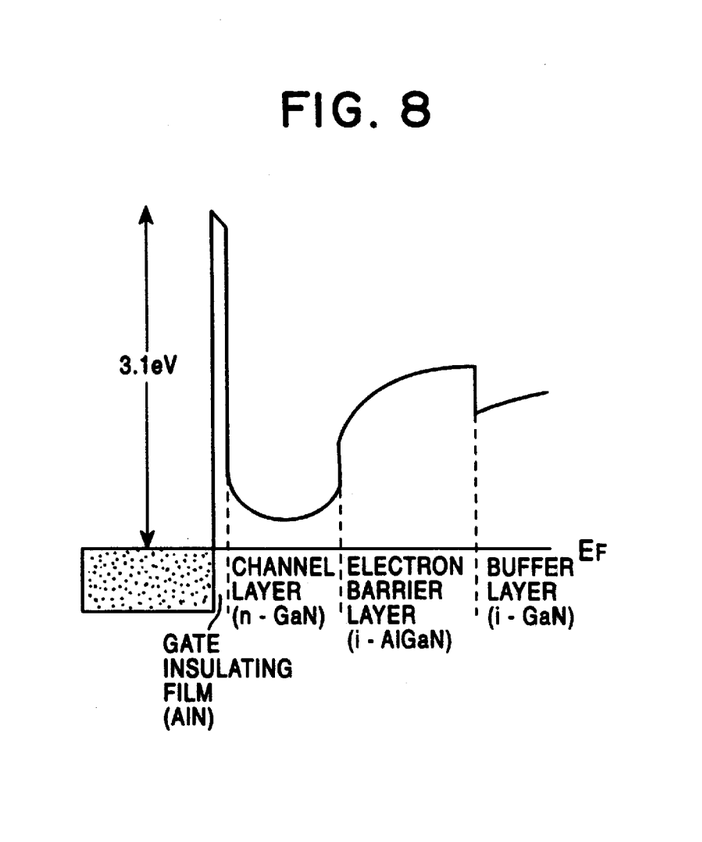
FIG. 8 schematically illustrates the conduction band under the gate electrode of the FET shown in FIG. 7.

FIG. 8 schematically illustrates the conduction band under the gate electrode 7. According to the FET of the second embodiment, since the channel layer 3 is sandwiched between the gate insulating film 4 and the electron barrier layer 9, electrons are stored in the channel layer 3, thereby increasing the mutual conductance $g_m$ and inhibiting the short channel effect. The above advantages are more effectively presented with the decreased thickness of the channel layer 3. Thus, the thickness of the channel layer 3 is smaller than that of the first embodiment.

The foregoing FET can be manufactured in a manner similar to the first embodiment. More specifically, after a GaN underlying layer (not shown) is grown on the substrate 1, the buffer layer 2, the electron barrier layer 9, the channel layer 3, and the gate insulating film 4 are sequentially grown according to the MOCVD method. The electron barrier layer 9 is grown under the conditions similar to those of the first embodiment.

The operation of the FET is as follows. The FET of this embodiment, as well as the FET of the first embodiment, is operated in the depletion mode. Thus, upon applying a negative voltage to the gate electrode 7, the drain current decreases. At this time, since the electron barrier layer 9 is formed immediately under the channel layer 3 having a decreased thickness, the mutual conductance $g_m$ increases, thereby operating the FET at high speed. Moreover, the short channel effect can be inhibited, thereby stabilizing a constant-current region and also maintaining the drain-source breakdown voltage. The foregoing advantages can also be exhibited even if the FET is operated in the enhancement mode.

In addition to the advantages described above, since the FET is provided with the AlN gate insulating film 4 as in the first embodiment, the advantages explained in the first embodiment are also offered.

(Third Embodiment)

Figure 9:
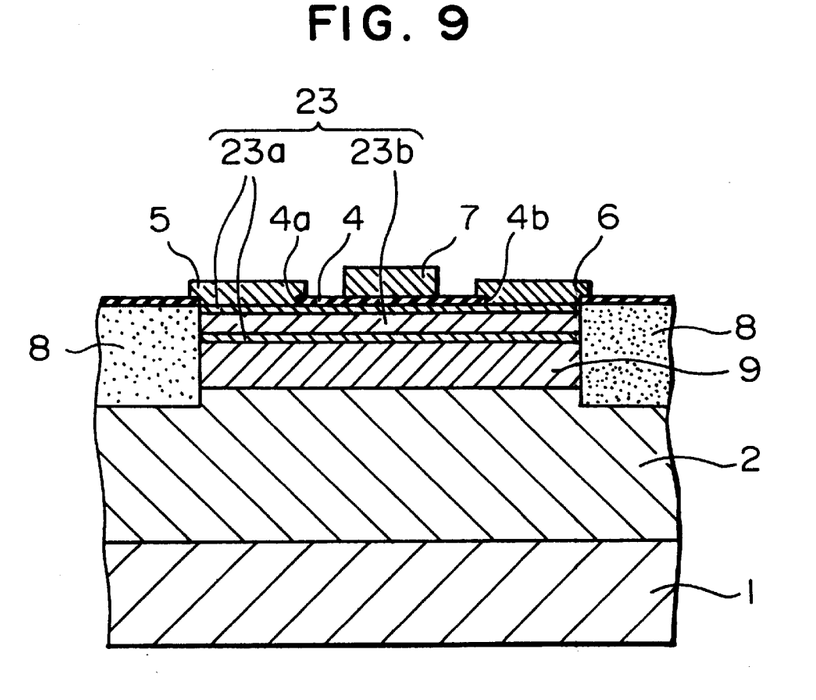
FIG. 9 is a sectional view illustrating the configuration of a FET according to a third embodiment of the present invention.

FIG. 9 illustrates the configuration of a FET according to a third embodiment of the present invention. This FET is similar to the counterpart of the second embodiment other than the structure of the channel layer. The same elements as those shown in FIG. 7 are designated by like reference numerals, and a detailed explanation thereof will thus be omitted.

In place of the channel layer 3 of the second embodiment, a channel layer 23 is constructed such that a carrier transit layer (an electron transit layer 23b in this embodiment) is interposed between two carrier supply layers (electron supply layers 23a in this embodiment). The electron supply layers 23a each has a thickness of, for example, 3 nm, and are formed from n-type GaN doped with an n-type impurity, such as Si, having an impurity concentration of, for example, $2\times10^{19}$ $cm^{-3}$. The electron transit layer 23b has a thickness of, for example, 10 nm, and is formed from $Ga_{1-y}In_yN$ which is not doped with an n-type impurity and a p-type impurity. The composition ratio of this Group-III element is, for example, 80% gallium and 20% indium (i.e., y=0.2).

Figure 10:
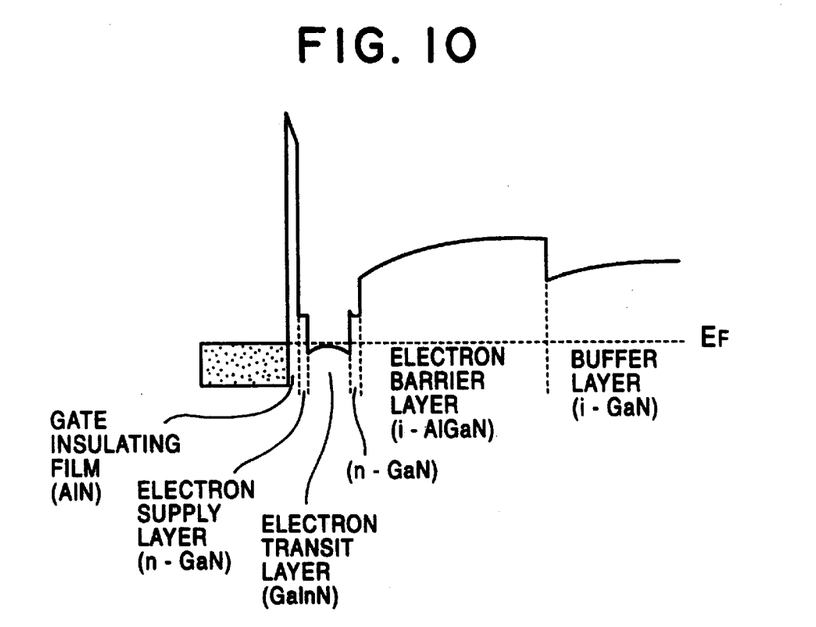
FIG. 10 schematically illustrates the conduction band under the gate electrode of the FET shown in FIG. 9.

FIG. 10 schematically illustrates the conduction band under the gate electrode 7. In the FET of this embodiment, the electron supply layers 23a and the electron transit layer 23b are heterojunction-coupled to each other. At the heterojunction interface, a depletion layer is formed in the electron supply layers 23a, while electrons (two-dimensional electron gas) are stored in the electron transit layer 23b. This structure is similar to the pseudomorphic HENT (PHEMT) used as a GaAs-type high-output transistor.

The above-described FET can be fabricated in a manner similar to the first embodiment. More specifically, after a GaN underlying layer (not shown) is grown on the substrate 1, the buffer layer 2, the electron barrier layer 9, one electron supply layer 23a, the electron transit layer 23b, the other electron supply layer 23a, and the gate insulating layer 4 are sequentially grown on the underlying layer according to the MOCVD method. For growing the electron transit layer 23b, trimethyl indium ($In(CH_3)_3$; TMIn) may be used as the indium material. The flow rates of the respective gases are, for example, as follows: TMG is 5 μmol/minute; and TMIn is 40 μmol/minute. As the carrier gas, only a nitrogen gas flows at a rate of 16 liters/minute. The temperature for growing the electron transit layer 23b is, for example, 800° C. The conditions for growing the electron barrier layer 9 and the electron transit layer 23b are similar to those set in the first embodiment.

The foregoing FET is operated as follows. In this FET, a two-dimensional electron gas is stored in the electron transit layer 23b. Thus, upon applying a voltage to the gate electrode 7, the concentration of the two-dimensional electron gas increases or decreases in accordance with the voltage, thereby changing the drain current flowing between the source electrode 5 and the drain electrode 6. At this time, since the electron transit layer 23b is separated from the electron supply layers 23a, electrons are able to transit without being influenced by the scattering of the impurity contained in the electron supply layers 23a. This increases the mobility of the electrons, thereby enabling the FET to operate at high speed.

In this fashion, according to the FET of the third embodiment, since the channel layer 23 is formed of the electron supply layers 23a and the electron transit layer 23b, electrons are capable of transitting without being affected by the scattering of impurities, thereby enhancing the mobility of the electrons. As a consequence, the FET is operable at high speed. Additionally, since the FET of this embodiment, as well as the counterpart of the first embodiment, is provided with the AlN gate insulating film 4, the advantages discussed in the first embodiment can also be offered. Further, the electron barrier layer 9 explained in the second embodiment is also provided in the third embodiment, thereby exhibiting advantages discussed in the second embodiment.

(Fourth Embodiment)

Figure 11:
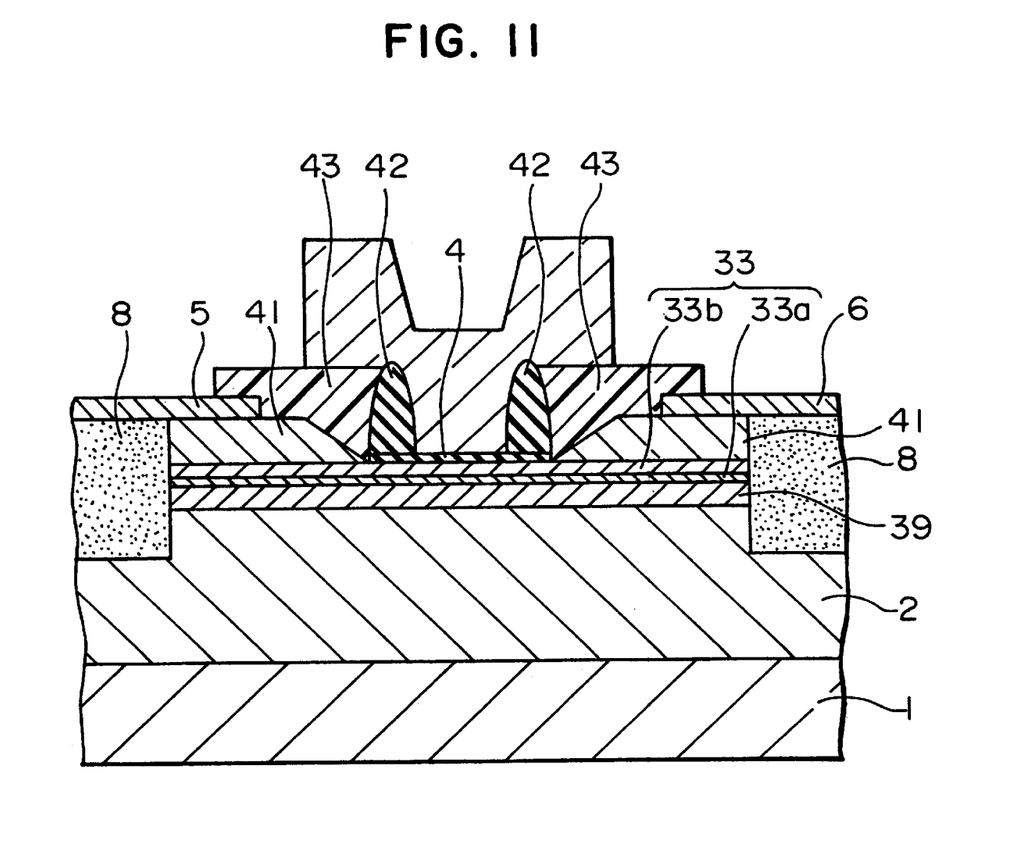
FIG. 11 is a sectional view illustrating the configuration of a FET according to a fourth embodiment of the present invention.

FIG. 11 illustrates the configuration of a FET according to a fourth embodiment of the present invention. The FET of the fourth embodiment is configured in a manner similar to the third embodiment in the following points. An electron barrier layer 39 and a channel layer 33 are sequentially laminated on the substrate 1 with the buffer layer 2 therebetween. The source electrode 5 and the drain electrode 6 are disposed on the channel layer 33, and the gate electrode 7 is provided between the source electrode 5 and the drain electrode 6 with the gate insulating film 4 therebetween. Namely, the FET of this embodiment is constructed similarly to the third embodiment other than the configurations of the electron barrier layer 39 and the channel layer 33, and electrical connections of the source electrode 5, the drain electrode 6 and the gate electrode 7 to the channel layer 33. The same elements as those shown in FIG. 9 are designated by like reference numerals, and a detailed explanation thereof will thus be omitted.

The potential barrier layer 39, as well as the counterpart of the third embodiment, has a thickness of, for example, 0.05 $\mu$m, and is formed from high-resistance intrinsic $Al_xGa_{1-x}N$. The composition ratio of this Group-III element is, however, 30% aluminum and 70% gallium (i.e., x=0.3), unlike the third embodiment.

The channel layer 33 is formed of a carrier supply layer (an electron supply layer 33a in this embodiment), which is disposed on the electron barrier layer 39, and a carrier transit layer (an electron transit layer 33b in this embodiment). The electron supply layer 33a has a thickness of, for example, 5 nm and is made from n-type $Al_xGa_{1-x}N$ doped with an n-type impurity, such as Si, having an impurity concentration of, for example, $1\times10^{19}$ $cm^{-3}$. The composition ratio of this Group-III element is, for example, 15% aluminum and 85% gallium (i.e., x=0.15). The electron transit layer 33b has a thickness of, for example, 10 nm, and is made from GaN which is not doped with an type impurity or a p-type impurity.

Formed on the channel layer 33 is a contact layer 41 in the vicinity of the gate insulating film 4. The source electrode 5 and the drain electrode 6 are respectively disposed on the contact layer 41 on the left and right sides of FIG. 11. The contact layer 41 has a thickness of, for example, 0.3 $\mu$m, and is formed from n-type $Ga_{1-y}In_yN$ doped with an n-type impurity, such as Si, having an impurity concentration of $5\times10^{19}$ $cm^{-3}$. The composition ratio of this Group-III element is 85% gallium and 15.2% indium (i.e., y=0.15).

Formed on the gate insulating film 4 are insulating side walls 42 and a gate electrode 7 provided with the side walls 42 on the lateral surfaces near the insulating film 4. The side walls each have a width of, for example, approximately 0.2 $\mu$m and is made from silicon nitride ($Si_3N_4$). Namely, in the FET of this embodiment, the gate electrode 7 and the contact layer 41, which is connected to the source electrode 5, are placed in proximity with each other with a minimal width of the side wall 42, thereby decreasing the resistance (i.e., the source resistance) between the source electrode 5 and the gate electrode 7. Further, the contact area of the gate electrode 7 with the gate insulating film 4 is decreased due to the presence of the side walls 42, which is referred to as "the T gate structure", thereby decreasing the resistance of the gate electrode 7 (i.e., the gate resistance).

An insulating film 43 is disposed between the gate electrode 7 and each of the source electrode 5 and the drain electrode 6 in order to ensure electrical insulation therebetween. The insulating film 43 is made from, for example, polyimide.

The FET constructed as described above can be manufactured according to the following procedure. FIGS. 12 through 15 illustrate the manufacturing process steps of the FET.

Figure 12A:
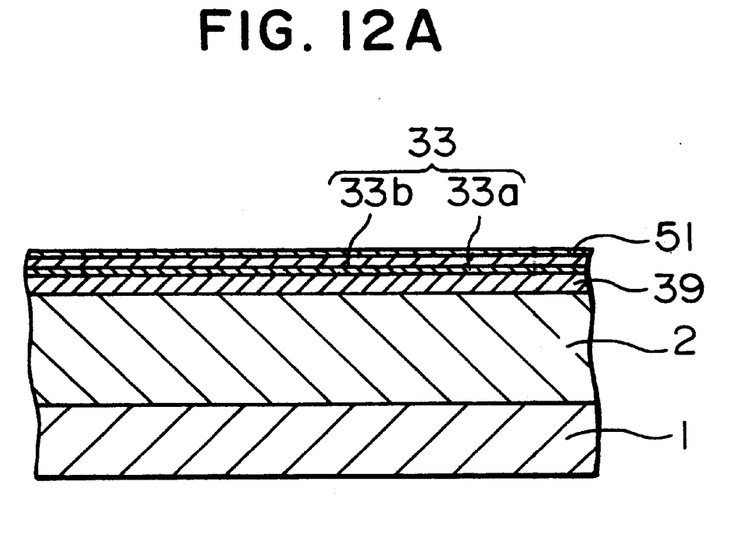

As illustrated in FIG. 12A, in a manner similar to the first embodiment, after a GaN underlying layer is grown on the substrate 1, the buffer layer 2, the electron barrier layer 39, the channel layer 33 (the electron supply layer 33a and the electron transit layer 33b), and an AlN layer 51 to form the gate insulating film 4 are grown according to, for example, the MOCVD method (channel-layer forming process step, and the AlN-layer forming process step). The conditions for performing the MOCVD method are similar to those of the first embodiment.

Figure 12B:
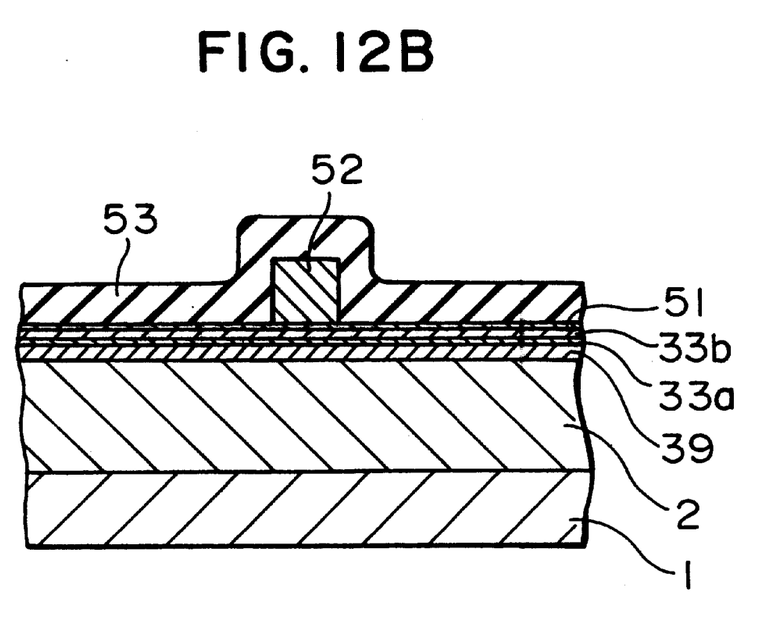

Then, as shown in FIG. 12B, a silicon oxide ($SiO_2$) layer with a thickness of 0.6 $\mu$m is laminated on the AlN layer 51 according to, for example, the chemical vapor deposition (CVD) method, and is partially removed by etching using a lithographic technology, thereby forming a 0.8 $\mu$m-width dummy gate 52 (dummy-gate forming process step). Subsequently, as illustrated in FIG. 12B, a $Si_3N_4$ layer 53 with a thickness of 0.3 $\mu$m is laminated on the overall surface (i.e., on the dummy gate 52 and the AlN layer 51) according to, for example, the sputtering method. Then, the $Si_3N_4$ layer 53 is removed, as shown in FIG. 13A, according to the RIE method using a gas containing, for example, tetrafluoromethane ($CF_4$), thereby forming the side walls 42 on the lateral surfaces of the dummy gate 52 (side-wall forming process step).

Figure 13A:
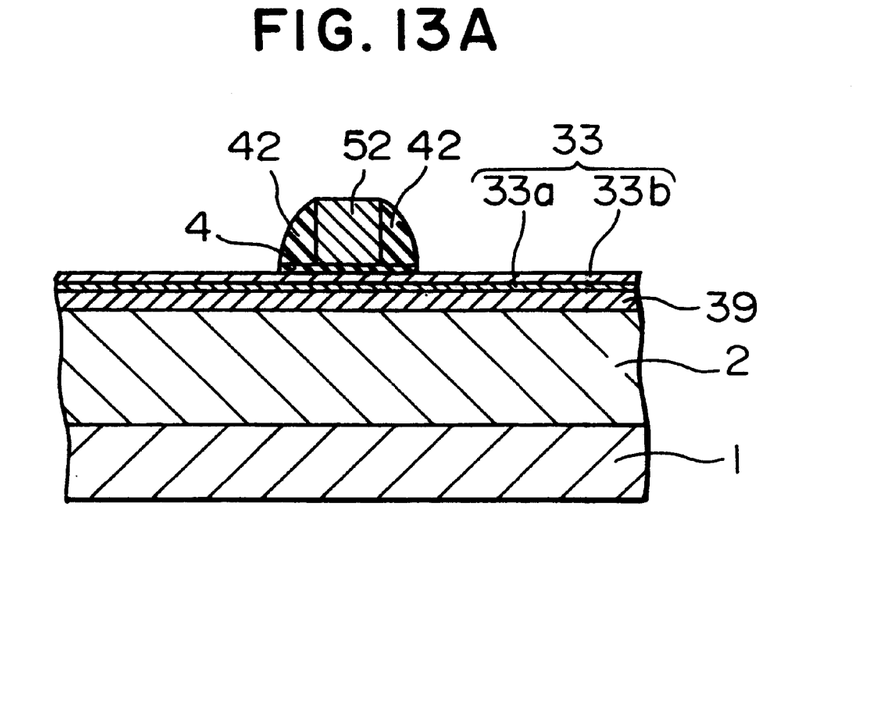

After the formation of the side walls 42, the AlN layer 51 is partially removed, as shown in FIG. 13A, by wet etching using, for example, an alkali solution, and using the dummy gate 52 and the side walls 42 as an etching mask, thereby forming the gate insulating film 4 (gate-insulating-film forming process step). The known etching technique using an alkali solution (J. R. Mileham, Appl. Phys. Lett.,67(1996) 1119.) may be used for the AlN layer 51 by soaking the AlN layer 51 for 30 minutes in an alkali solution which is heated to approximately 60° C.

Figure 13B:
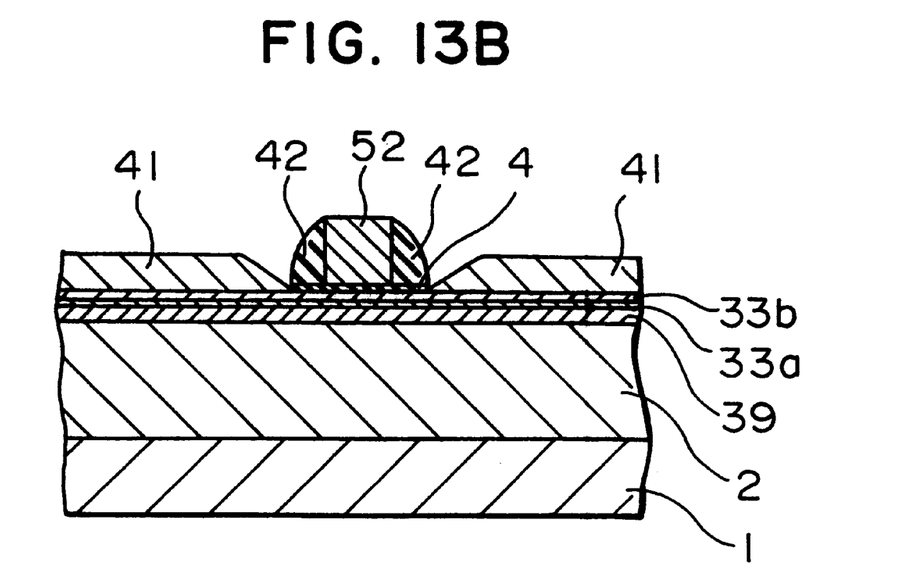

The contact layer 41 is then-grown, as illustrated in FIG. 13B, on the overall surface on the channel layer 33 according to, for example, the MOCVD method. The contact layer 41 is not, however, epitaxially grown on the channel layer 33 on which the dummy gate 52 and the side walls 42 are mounted. That is, by virtue of the presence of the. dummy gate 51 and the side walls 42, the contact layer 41 is selectively formed on the electron transit layer 33b adjacent to the gate insulating film 4 (contact-layer forming process step).

Figure 14A:
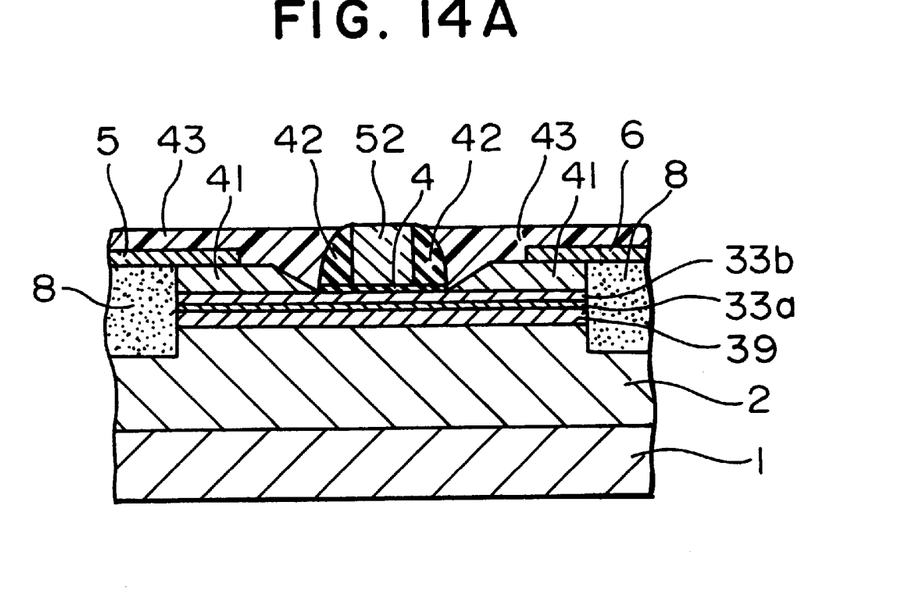

Thereafter, the separating portions 8 are formed, as shown in FIG. 14A, as in the first embodiment. Then, titanium, aluminum and gold are sequentially deposited on the contact layer 41 according to, for example, the selective lift-off method, thereby forming the source electrode 5 and the drain electrode 6. The source electrode 5 and the drain electrode 6 are then heat-treated in, for example, a nitrogen gas atmosphere, at about 700° C. for one minute, thereby reducing the contact resistance of the source electrode 5 and the drain electrode 6 (source electrode and drain-electrode forming process step).

Subsequently, a polyimide film is applied to the overall surface (i.e., the source electrode 5, the drain electrode 6, the contact layer 41, the side walls 42, and the dummy gate 52). The polyimide film is then partially removed (etched) according to the RIE method using, for example, a $CF_4$-containing gas so as to expose the surface of the dummy gate 52, thereby forming the insulating film 43 (insulating-film forming process step).

Figure 14B:
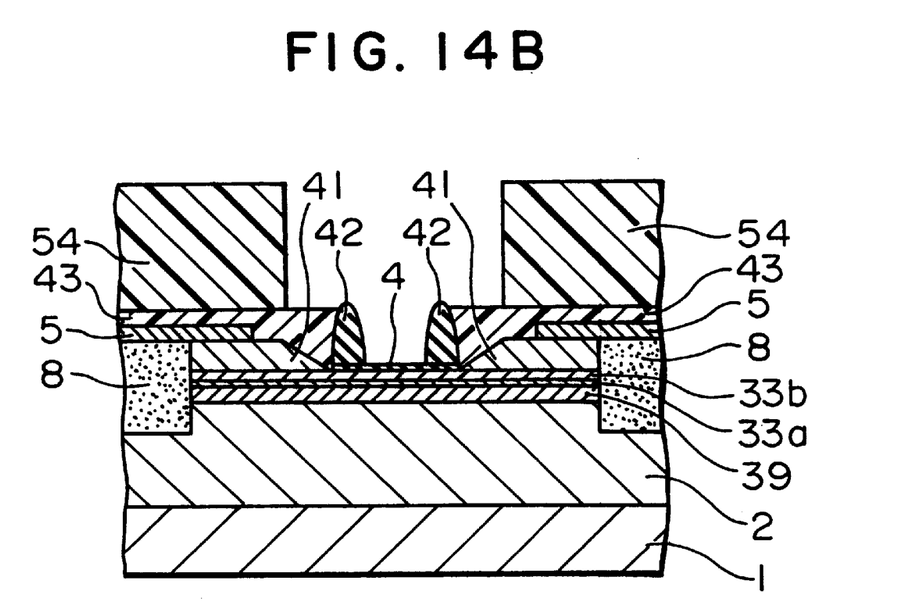

Then, as shown in FIG. 14B, a resist film 54 is applied to the overall surface (i.e., the insulating film 43 and the dummy gate 52), and an opening 54a having a width larger than the dummy gate 52 is formed to expose the dummy gate 52. The dummy gate 52 is then removed by wet etching using an etching solution containing hydrogen fluoride (HF).

Figure 15:
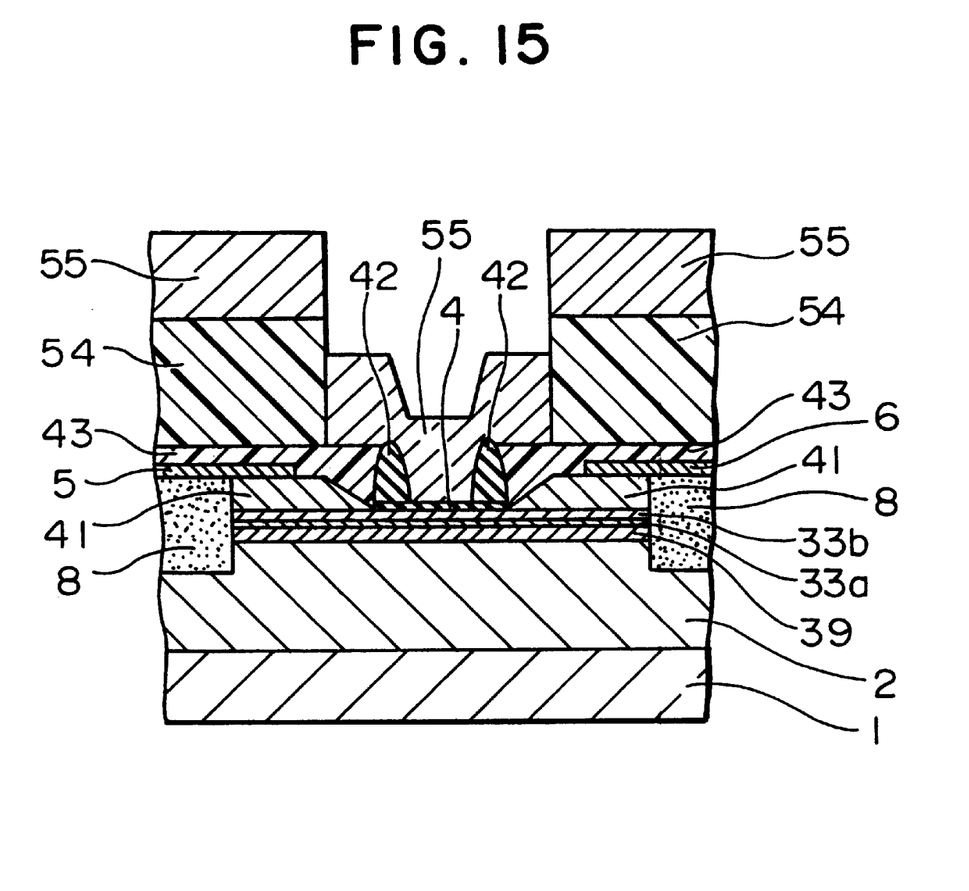
FIG. 15, is a sectional view illustrating the manufacturing process steps following the steps shown in FIG. 14.

After the removal of the dummy gate 52, titanium, aluminum and gold are sequentially deposited, as illustrated in FIG. 15, on the overall surface (the gate insulating film 4, the insulating film 43 and the resist film 54), thereby forming a metal film 55. The resist film 54 is then removed (lifted off) together with the metal film 55, thereby forming the gate electrode 7 (gate-electrode forming process step). Simultaneously, the insulating film 43 is partially removed by dry etching using a gas containing oxygen ($O_2$) and $CF_4$, thereby partially exposing the source electrode 5 and the drain electrode 6. As a consequence, the FET shown in FIG. 11 is fabricated.

The FET manufactured as described above is operated as follows. Upon applying a voltage to the gate electrode 7, the concentration of the two-dimensional electron gas in the electron transit layer 33b increases and decreases according to the applied voltage, thereby changing the drain current flowing between the source electrode 5 and the drain electrode 6. Further, as discussed above, the gate electrode 7 and the contact layer 41, which is connected to the source electrode 5, are placed in proximity with each other across the side wall 42, thereby decreasing the source resistance.

The FET of this embodiment has the AlN gate insulating film 4 as in the first embodiment and also has the electron barrier layer 39 as in the second embodiment. Moreover, as in the third embodiment, the channel layer 33 is formed of the electron supply layers 33a and the electron transit layer 33b. Thus, the advantages exhibited by the first through third embodiments are also offered by the fourth embodiment.

According to the manufacturing method for the FET of the fourth embodiment, the gate insulating film 4 is formed by utilizing the dummy gate 52 and the side walls 42. This simplifies the manufacturing process, thereby easily achieving the FET of this embodiment.

The present invention has been explained through illustration of the foregoing embodiments. The embodiments are not however intended to restrict the present invention, and various modifications and changes may be made. For example, although in the foregoing embodiments the gate insulating film 4 is made from AlN, other types of Group-III nitride compound semiconductors containing at least aluminum, which has a high resistance, may be used as Group-III elements without impairing the effect of the invention. In particular, Group-III nitride compound semiconductors expressed by the chemical formula $Al_xG_{2-x}N$. (0.3<X<1) are preferably used because they have a high level of resistance. Among others, AlN is most preferably used since the resistance increases with a larger content of aluminum in the composition.

Moreover, in the foregoing embodiments the same type of constituent material for the gate electrode 7 as that of the source electrode 5 and the drain electrode 6 is used for the sake of a simple fabrication process. Other types of constituent materials may be employed for the gate electrode 7, in which case, the material which is optimal in terms of the work function may be selected. For example, if the Schottky barrier is desired to be increased, platinum (Pt), palladium (Pd) and nickel (Ni), all of which have a large work function, are suitable. Molybdenum (Mo) and tungsten (W) are appropriate in high-temperature atmospheres at temperatures exceeding 300° C., such as in automobile engines, atomic and chemical plants, and outer-space atmospheres.

Further, the thickness of the gate insulating film 4 has been determined to be specific values in the foregoing embodiments. The thickness of this film 4 is preferably smaller, such as 50 nm or less, and more preferably 10 nm or less, in order to increase the mutual conductance $g_m$, though it is preferably 1 nm or greater in order to ensure the uniform gate insulating film 4, as has been discussed in the first embodiment.

Additionally, although in the third embodiment the electron supply layers 23a (i.e., the carrier supply layers) are disposed on both surfaces of the electron transit layer 23b (i.e., the carrier transit layer), only one electron supply layer 23a may be provided. Further, although in the fourth embodiment the electron supply layer 33a (i.e., the carrier supply layer) is disposed on one surface of the electron transit layer 33b (i.e., the carrier transit layer) closer to the substrate 1, it may be provided at the other surface of the electron transit layer 33b away from the substrate 1. Alternatively, the electron supply layers 33a may be provided on both surfaces of the electron transit layer 33b.

Further, in the third embodiment, the electron transit layer 23b is formed from GaInN which is not doped with an n-type impurity or a p-type impurity. The electron transit layer 23b may be, however, made from GaInN doped with an n-type impurity or GaN doped with an n-type impurity or GaN which is not doped with an n-type impurity or a p-type impurity. Moreover, although the electron supply layers 23a are formed from GaN doped with an n-type impurity, it may be made from AlGaN doped with an n-type impurity.

Similarly, in the fourth embodiment, the electron transit layer 33b is made from GaN which is not doped with an n-type impurity or a p-type impurity. The electron transit layer 33b may be, however, formed from GaN doped with an n-type impurity or GaInN doped with an n-type impurity or GaInN which is not doped with an n-type impurity or a p-type impurity. Moreover, although the electron supply layer 33a is made from AlGaN doped with an n-type impurity, it may be formed from GaN doped with an n-type impurity.

In the second and fourth embodiments, the electron barrier layers 9 and 39 are made from intrinsic AlGaN, it may be formed from a Group-III nitride compound semiconductor which contains only gallium or both gallium and aluminum as Group-III elements and which has a resistance higher than the electron supply layers 33a or is doped with a p-type impurity.

Further, in the third and fourth embodiments, a spacer layer made from intrinsic GaN (having a thickness of, for example, 1 nm) may be interposed between the electron supply layers 23a and 33a and the electron transit layers 23b and 33b, respectively, thereby further improving the electron mobility.

In the fourth embodiment, the dummy gate 52 is formed from $SiO_2$ and is removed prior to the formation of the gate electrode 7. However, the dummy gate 52 may be formed from a heat-resistance metal (metal that is resistant to heat treatment at, for example, 700° C. or higher), such as tungsten or molybdenum, and may be used as part of the gate electrode 7 rather than being removed.

Additionally, although in the foregoing embodiments the channel layer 3 is made from an n-type Group-III element nitride compound semiconductor, it may be formed from a p-type Group-III element nitride compound semiconductor.

Further, in the foregoing embodiments, the electron barrier layers 9 and 39, the channel layers 3, 23, 33, the gate insulating film 4, and the contact layer 41 are epitaxially grown according to the MOCVD method. However, other types of methods, such as the molecular beam epitaxy (MBE), metal organic molecular beam epitaxy (MOMBE), or other types of CVD methods may be employed.

As is seen from the foregoing description, the present invention offers the following advantages.

According to the depletion-mode FET of the present invention, a gate insulating film formed from a high-resistance Group-III element nitride compound semiconductor containing at least aluminum is provided, thereby increasing the insulating barrier of the gate electrode. This makes it possible to apply a large gate voltage to the gate electrode, thereby obtaining a high level of output. Even if the FET is operated in the enhancement mode, a sufficient gate voltage can also be applied to the gate electrode, thereby enabling the FET to operate in a manner similar to the Si-MOS-type FET, resulting in the formation of an inversion layer. No matter whichever type of the FET is used in the present invention, the range of the selections for the constituent materials for forming the gate electrode is extended, thereby increasing the flexibility in the manufacturing process. Additionally, since the thickness of the gate insulating film can be decreased, the mutual conductance $g_m$ increases, thereby making it possible to operate the FET at high speed.

According to the manufacturing method for the FET of the present invention, by virtue of the dummy gate and the side walls formed on the AlN layer made of a gate oxide film, the gate insulating film 4 is formed. This simplifies the manufacturing process, thereby easily fabricating the FET in which the gate electrode is provided with the side walls on the lateral surfaces.

What is claimed is:

1. A manufacturing method for a field effect transistor of the type in which a source electrode and a drain electrode are disposed on a channel layer composed of a Group-III nitride compound semiconductor containing nitride and at least one of the Group-III elements selected from the group consisting of gallium (Ga), aluminum (Al), boron (B), and indium (In), and a gate electrode is formed on said channel layer with a gate insulating film therebetween, said method comprising the steps of:

forming a gate-insulating-film forming layer after said channel layer is formed;

forming a dummy gate, which serves as said gate electrode, on said gate-insulating-film forming layer;

forming side walls on lateral surfaces of said dummy gate; and forming said gate insulating film by selectively removing said gate-insulating-film forming layer using said dummy gate and said side walls as a mask.

2. A manufacturing method according to claim 1, further comprising the step of forming said source electrode and said drain electrode on a contact layer, which is selectively formed on said channel layer by using said dummy gate and said side walls after said gate-insulating-film forming step.

3. A method of manufacturing a field effect transistor, the method comprising the steps of:

forming a channel layer on a substrate;

forming a gate-insulating-film forming layer on the channel layer;

forming a dummy gate on the gate-insulating-film forming layer;

forming side walls on lateral surfaces of the dummy gate; and forming a gate insulating film by selectively removing the gate-insulating-film forming layer using the dummy gate and the side walls as a mask.

4. The method of claim 3 further comprising the step of forming a buffer layer and an electron barrier layer on the substrate.

5. The method of claim 3 wherein the gate-insulating-film forming layer comprises an aluminum nitride.

6. The method of claim 3 wherein the step of forming a dummy gate on the gate-insulating-film forming layer is further defined by the steps of:

laminating a silicon oxide layer on the gate-insulating-film forming layer; and partially removing the silicon oxide layer by etching to form the dummy gate.

7. The method of claim 3 wherein the step of forming side walls on lateral surfaces of the dummy gate is further defined by the steps of:

laminating a silicon nitride layer on the dummy gate and the gate-insulating-film forming layer; and removing the silicon nitride layer to form the side walls.

8. The method of claim 3 wherein the step of forming the gate-insulating-film is further defined by the steps of:

partially removing the gate-insulating-film forming layer by wet etching; and using the dummy gate and the side walls as an etching mask to form the gate insulating film.

9. The method of claim 3 further comprising the step of: forming a contact layer on the channel layer.

10. The method of claim 3 further comprising the step of: forming a source electrode and a drain electrode on the channel layer.

11. The method of claim 3 further comprising the step of: forming an insulating-film on the channel layer.

12. The method of claim 3 further comprising the step of: forming a gate electrode on the channel layer.

* * * * *